US008324694B2

(12) United States Patent
Mikami et al.

(10) Patent No.: US 8,324,694 B2
(45) Date of Patent: Dec. 4, 2012

(54) MEMS SWITCH

(75) Inventors: Mayumi Mikami, Kanagawa (JP); Konami Izumi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 672 days.

(21) Appl. No.: 12/269,146

(22) Filed: Nov. 12, 2008

(65) Prior Publication Data

US 2009/0127081 A1 May 21, 2009

(30) Foreign Application Priority Data

Nov. 13, 2007 (JP) ................................ 2007-293964

(51) Int. Cl.
*H01L 29/82* (2006.01)

(52) U.S. Cl. ....................................... 257/415; 257/417

(58) Field of Classification Search .......... 257/415–420, 257/E29.105

See application file for complete search history.

(56) References Cited

U.S. PATENT DOCUMENTS

| | | | |
|---|---|---|---|
| 4,939,401 A | 7/1990 | Farrall | |
| RE33,691 E | 9/1991 | Harnden, Jr. et al. | |
| 5,578,976 A | 11/1996 | Yao | |
| 6,037,719 A | 3/2000 | Yap et al. | |
| 6,392,618 B1 | 5/2002 | Kimura | |
| 6,515,791 B1 | 2/2003 | Hawwa et al. | |
| 6,566,617 B1 | 5/2003 | Suzuki et al. | |
| 7,057,251 B2 * | 6/2006 | Reid | 257/432 |
| 7,101,724 B2 * | 9/2006 | Chou | 438/48 |
| 7,420,320 B2 | 9/2008 | Sano et al. | |
| 7,545,081 B2 | 6/2009 | Kim et al. | |
| 7,679,186 B2 | 3/2010 | Jung et al. | |
| 2003/0222321 A1 | 12/2003 | Yang et al. | |
| 2003/0227361 A1 | 12/2003 | Dickens et al. | |
| 2004/0031670 A1 | 2/2004 | Wong | |
| 2004/0140872 A1 | 7/2004 | Wong | |
| 2006/0208612 A1 | 9/2006 | Takayama et al. | |
| 2007/0093045 A1 | 4/2007 | Yamaguchi et al. | |
| 2007/0218630 A1 | 9/2007 | Yamaguchi et al. | |
| 2008/0176046 A1 | 7/2008 | Yamaguchi et al. | |
| 2008/0237005 A1 | 10/2008 | Honda | |

FOREIGN PATENT DOCUMENTS

EP 1150318 A1 10/2001

(Continued)

OTHER PUBLICATIONS

European Search Report for Application No. 08019774.2, dated Jan. 29, 2010, 9 pages.

*Primary Examiner* — Cuong Q Nguyen
(74) *Attorney, Agent, or Firm* — Fish & Richardson P.C.

(57) ABSTRACT

An object is that contact between an upper switch electrode and a lower switch electrode is not hindered. The present invention relates to a MEMS switch including a substrate; a structural layer with a beam structure in which at least one end is fixed to the substrate; a lower drive electrode layer and a lower switch electrode layer which are provided below the structural layer and on a surface of the substrate; and an upper drive electrode layer and an upper switch electrode layer which are provided on a surface of the structural layer, which is opposite to the substrate, so as to face the lower drive electrode layer and the lower switch electrode layer, respectively, in which the upper switch electrode layer is larger than the lower switch electrode layer.

21 Claims, 7 Drawing Sheets

FOREIGN PATENT DOCUMENTS

| | | | |
|---|---|---|---|
| JP | 60-247622 | | 12/1985 |
| JP | 09-092909 | | 4/1997 |
| JP | 11-174994 | | 7/1999 |
| JP | 2000-208018 | | 7/2000 |
| JP | 2001-033827 | | 2/2001 |
| JP | 2003-217423 | | 7/2003 |
| JP | 3590283 | B2 | 11/2004 |
| JP | 2005-528751 | | 9/2005 |
| JP | 3865942 | B2 | 1/2007 |

* cited by examiner

MEMS SWITCH

BACKGROUND OF THE INVENTION

1. Field of the Invention

The present invention relates to a structure of a MEMS (micro electro mechanical systems) switch.

2. Description of the Related Art

MEMS is also called a "micro machine" or a "MST (micro system technology)" and refers to a system in which a minute mechanical structure and an electric circuit formed of a semiconductor element are combined. A microstructure has a three-dimensional structure which is partially movable in many cases, unlike a semiconductor element such as a transistor. An electric circuit controls motion of a microstructure or receives and processes a signal from the microstructure. Such a micro machine formed of a microstructure and an electric circuit can have a variety of functions: for example, a sensor, an actuator, and a passive element such as an inductor or a variable capacitor.

A microstructure characterizing a micro machine includes a structural layer having a beam structure in which an end portion thereof is fixed to a substrate and a vacant space between the substrate and the structural layer. A microstructure in which the structural layer is partially movable since there is a space can realize a variety of functions one of which is a switch. A MEMS switch formed of a microstructure is turned on or off with or without physical contact unlike a field-effect switching transistor and thus has advantages such as good isolation when it is off and less insertion loss when it is on.

Further, a MEMS includes not only a microstructure but an electric circuit in many cases; therefore, it is preferable that it can be manufactured applying a process the same as or similar to that of a semiconductor integrated circuit. In the present invention, described is a MEMS switch utilizing a surface micromachine technology for manufacturing a structure with a stack of thin films.

A MEMS switch includes a bridge structure (structural layer) over a substrate and two or more pairs of electrodes facing each other on a surface of the substrate and the substrate side of the bridge structure. By applying a voltage to one pair of electrodes, the bridge structure is pulled down to the substrate side by an electrostatic attractive force and the other pair of electrodes physically come in contact with each other, so that the MEMS switch is turned on (Patent Document 1: Japanese Translation of PCT International Application No. 2005-528751 and Patent Document 2: Japanese Published Patent Application No. 2003-217423).

Further, in order to prevent contact between a pair of electrodes to which a voltage is applied, a stopper for limiting a movable region of a structural layer (also referred to as a bumper or a bump) is generally formed (Patent Document 1).

SUMMARY OF THE INVENTION

Different two problems have led to the present invention. The first problem is that a stopper for avoiding charge build-up in an insulating layer is required to be formed (see Patent Document 1) and thus another photomask is required. In order to reduce manufacturing cost, it is preferable that the number of photomasks be reduced to reduce the number of steps; therefore, the stopper is preferably formed without adding a photomask.

The second problem is due to a process. Because of overetching of a sacrificial layer, which occurs in formation of upper electrodes, a structural layer protrudes downward from bottom surfaces of the upper electrodes and thus contact between an upper switch electrode and a lower switch electrode are hindered.

One aspect of the present invention is to solve the second problem first. Then, that can solve the first problem.

As for a micro electro mechanical systems switch (MEMS switch) of the present invention, an upper switch electrode is formed to have a larger area than a lower switch electrode so that contact between the upper switch electrode and the lower switch electrode can be prevented from being hindered even if the structural layer protrudes due to overetching.

Further, as for a MEMS switch of the present invention, an upper drive electrode is formed to have a smaller area than a lower drive electrode so that a portion in which a structural layer protrudes downward from a bottom surface of the upper drive electrode due to the overetching can be a stopper for preventing contact between the upper drive electrode and the lower drive electrode.

Further, as for a MEMS switch of the present invention, an upper switch electrode is formed to have a larger area than a lower switch electrode and an upper drive electrode is formed to have a smaller area than a lower drive electrode, so that contact between the upper switch electrode and the lower switch electrode is prevented from being hindered and a stopper for preventing contact between the upper drive electrode and the lower drive electrode can be provided.

By the present invention, the problem due to a process, in which contact between an upper switch electrode and a lower switch electrode is hindered, can be prevented.

Further, a stopper for preventing contact between an upper electrode and a lower electrode of a switch can be formed without adding a photomask and a step.

Further, since the two problems can be solved at the same time by designing a photomask of the upper electrode, manufacturing cost can be reduced.

DETAILED DESCRIPTION OF THE INVENTION

Figure 1A:
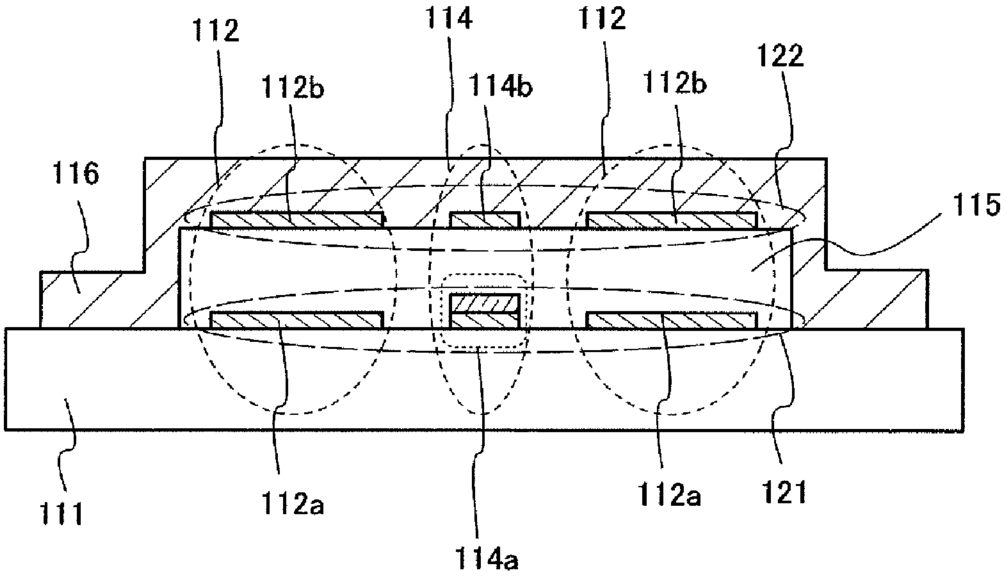
FIG. 1 is a cross-sectional view of a MEMS switch of the present invention.

The embodiment modes and embodiment of the present invention will be described with reference to the accompanying drawings. However, the present invention is not limited to the following description because it will be easily understood by those skilled in the art that various changes and modifications can be made to the modes and their details without departing from the spirit and scope of the present invention.

Therefore, the present invention should not be construed as being limited to the description in the following embodiment modes and embodiment. Note that like reference numerals may refer to like parts throughout the drawings in the structure of the present invention.

Embodiment Mode 1

First, a structure of the micro electro mechanical systems switch (MEMS switch) of the present invention and a manufacturing method thereof are described.

The micro electro mechanical systems switch (MEMS switch) includes a structural layer 116 having a beam structure in which both ends thereof are fixed to a substrate, lower drive electrode layers 112*a* and a lower switch electrode layer 114*a* which are provided below the structural layer 116, upper drive electrode layers 112*b* and an upper switch electrode layer 114*b* which are provided on a surface of the structural layer 116, which faces the substrate 111.

The upper drive electrode layers 112*b* and the upper switch electrode layer 114*b* are arranged to face the lower drive electrode layers 112*a* and the lower switch electrode layer 114*a*, respectively. When a potential difference is given between the upper drive electrode layers 112*b* and the lower drive electrode layers 112*a*, the structural layer 116 is attracted to the substrate 111 side by an electrostatic attractive force, so that the upper switch electrode layer 114*b* and the lower switch electrode layer 114*a* come in contact with each other. Thus, the MEMS switch functions as a switch.

Although the structural layer 116 has a post-and-beam structure in which both ends thereof are fixed to the substrate 111 in FIG. 1, a cantilever structure in which one of the ends thereof is fixed to the substrate may alternatively be adopted. Further, although the MEMS switch in FIG. 1 includes two upper drive electrode layers and two lower drive electrode layers and switch electrode layers between the upper drive electrode layers and between the lower drive electrode layers, the number of pairs of drive electrode layers for one switch is not necessarily two and may be one or three or more.

The lower drive electrode layers 112*a* and the lower switch electrode layer 114*a* are formed on a surface of the substrate 111 and may be collectively referred to as lower electrode layers 121. Similarly, the upper drive electrode layers 112*b* and the upper switch electrode layer 114*b* are formed on a surface of the structural layer 116, which faces the substrate 111, and may be collectively referred to as upper electrode layers 122. Further, the upper drive electrode layers 112*b* and the lower drive electrode layers 112*a* may be collectively referred to as drive electrode layers 112 (or pull-down electrode layers), and the upper switch electrode layer 114*b* and the lower switch electrode layer 114*a* may be collectively referred to as switch electrode layers 114 (or contact electrode layers or contact point electrode layers).

In the case of driving the switch, the lower switch electrode layer 114*a* is formed thicker than each of the lower drive electrode layers 112*a* so that the upper switch electrode layer 114*b* and the lower switch electrode layer 114*a* come in contact with each other prior to contact between the upper drive electrode layers 112*b* and the lower drive electrode layers 112*a*.

This is because when a voltage is applied between the upper drive electrode layers 112*b* and the lower drive electrode layers 112*a*, an attractive force is generated therebetween; therefore, in the case where the distance between each of the upper drive electrode layers 112*b* and each of the lower drive electrode layers 112*a* equals the distance between the upper switch electrode layer 114*b* and the lower switch electrode layer 114*a*, the upper drive electrode layers 112*b* and the lower drive electrode layers 112*a* come in contact with each other more easily than the upper switch electrode layer 114*b* and the lower switch electrode layer 114*a*.

Therefore, although not illustrated here, the upper switch electrode layer 114*b* may be formed thick to protrude downward so that the distance between the upper switch electrode layer 114*b* and the lower switch electrode layer 114*a* is reduced.

Next, a method for manufacturing a MEMS switch is described with reference to FIGS. 2A to 2E, FIGS. 3A to 3C, FIGS. 4A to 4E, and FIGS. 5A and 5B.

Figure 2A:
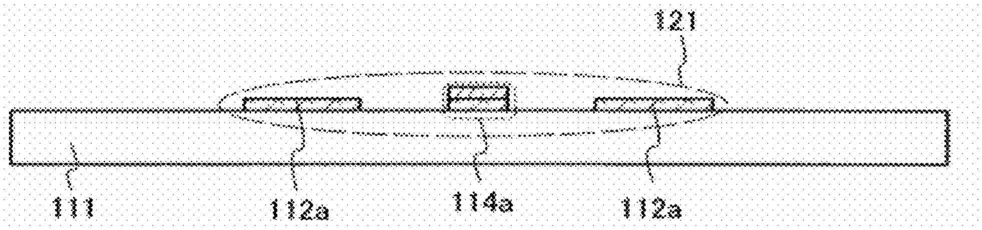
FIGS. 2A to 2E are cross-sectional views illustrating a manufacturing process of a MEMS switch of the present invention.

First, the lower electrode layers 121 are formed over the substrate 111 as illustrated in FIG. 2A.

Here, the substrate 111 may be any substrate such as a silicon substrate (semiconductor substrate), a glass substrate, or a metal substrate as long as it is a substrate of which a surface is provided with an insulating layer. It is to be noted that an insulating layer is not illustrated in FIG. 2A.

Figure 2B:
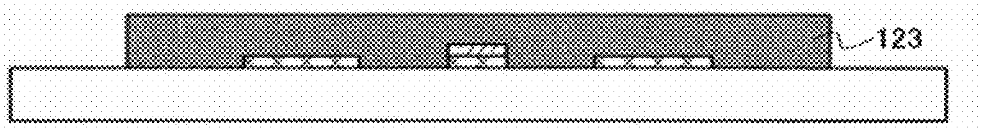

A sacrificial layer 123 is formed over the substrate 111 and the lower electrode layers 121 as illustrated in FIG. 2B. The sacrificial layer 123 is formed in a portion required for forming a space of the MEMS switch.

Figure 2C:
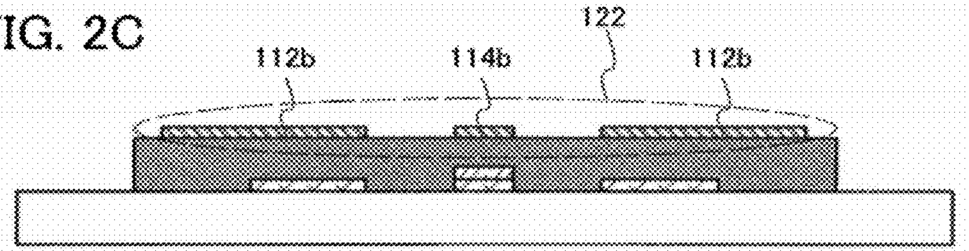

Then, the upper electrode layers 122 are formed over the sacrificial layer 123 as illustrated in FIG. 2C.

Figure 2D:
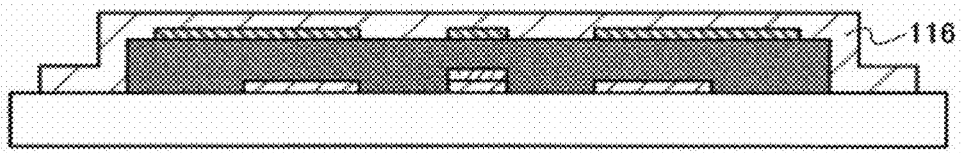

Then, the structural layer 116 is formed over the sacrificial layer 123 and the upper electrode layers 122 as illustrated in FIG. 2D. Since the structural layer 116 is formed of a material having an insulating property by a CVD method, a large step thereof formed due to the sacrificial layer 123 can be rounded. The structural layer 116 may be formed of, for example, an insulating layer. In specific, the structural layer 116 may be formed of a silicon oxide film containing nitrogen, a silicon nitride film containing oxygen, or a stack of them.

Figure 2E:
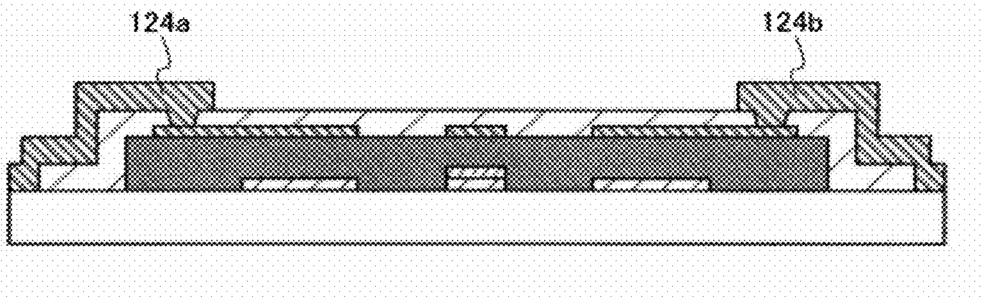

Next, contact holes are formed in the structural layer 116 as illustrated in FIG. 2E. Each of the contact holes is formed at a portion on which the upper electrode layer 122 exists and thus the sacrificial layer 123 is not exposed. Then, a wiring layer 124*a* and a wiring layer 124*b* which are electrically connected to the upper drive electrode layers 112*b* through the contact holes. The wiring layer 124*a* and the wiring layer 124*b* are formed rather thick using soft metal such as aluminum. By using such soft metal as a material of the wiring layer 124*a* and the wiring layer 124*b*, disconnection can be prevented when the wiring layers 124*a* and 124*b* are formed over the large step formed due to the sacrificial layer 123 and the structural layer 116.

Figure 3A:
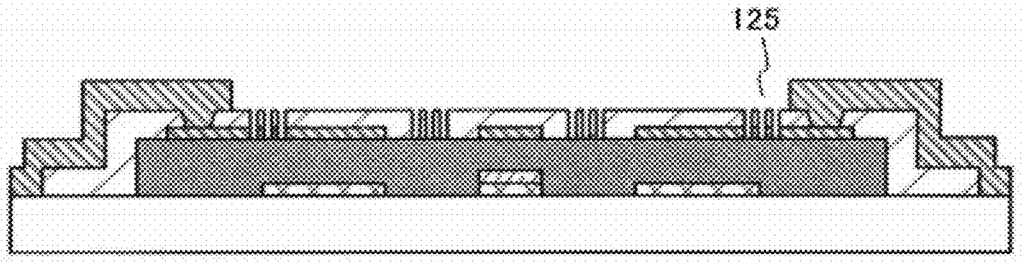
FIGS. 3A to 3C are cross-sectional views illustrating a manufacturing process of a MEMS switch of the present invention.

Then, as illustrated in FIG. 3A, the shape of the structural layer 116 is formed. The structural layer 116 is processed so that inlets 125 of an etchant used for etching the sacrificial layer 123 are formed. The shape of the structural layer 116 has holes penetrating the structural layer 116 and the upper drive electrode layers 112*b* as illustrated in FIG. 3A when seen in cross section and is a switch shape illustrated in FIG. 3C when seen from above. The shape in FIG. 3C is one of examples of a post-and-beam structure and the present invention is not limited thereto.

Figure 3B:
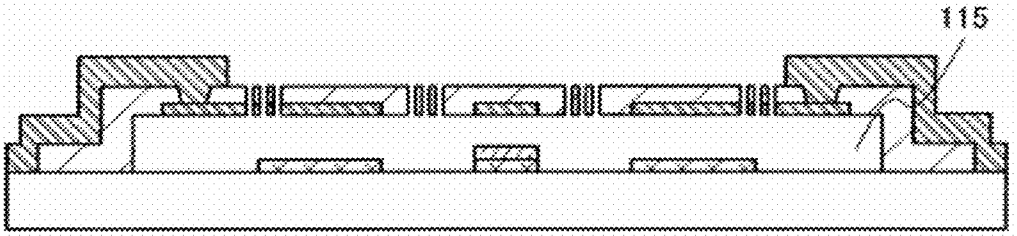
Figure 3C:
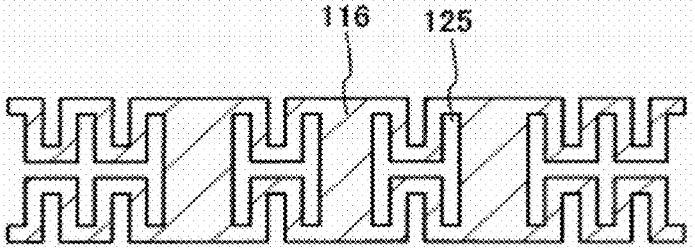

Finally, as illustrated in FIG. 3B, the sacrificial layer 123 is removed by being etched so that the space 115 is formed. Thus, the MEMS switch is completed.

A material of each layer such as the structural layer 116, the sacrificial layer 123, the upper electrode layers 122, or the lower electrode layers 121, which is formed by the above manufacturing method, has a property required for each layer and further, is decided in consideration of a relation with other layers.

For example, the structural layer 116 has to be a material having an insulating property. However, not all materials having an insulating property can be used. Since the structural layer 116 is exposed to an etchant when the sacrificial layer 123 is etched, a condition that the material having an insulating property is not removed by the etchant is required to be considered. Further, the etchant depends on a material of the sacrificial layer.

Specifically, in the case where the sacrificial layer 123 is formed of silicon, hydroxide of alkali metal, such as phosphoric acid, potassium hydroxide, sodium hydroxide, or cesium hydroxide, a tetramethylammonium hydroxide (TMAH) solution, or the like can be used as the etchant. A material which is not removed even when any of the above etchants (and which has an insulating property) has to be used for the structural layer 116 and, for example, silicon oxide can be used as the material.

Further, when the sacrificial layer 123 is etched, the upper electrode layers 122 and the lower electrode layers 121 are also exposed to the etchant; therefore, the upper electrode layers 122 and the lower electrode layers 121 are decided in consideration of a condition that they have conductive properties and are not removed by the etchant used when the sacrificial layer 123 is etched.

In this embodiment mode, for example, the structural layer 116 can be formed of silicon oxide, the sacrificial layer 123 can be formed of tungsten (or polyimide), and the upper and lower electrode layers 122 and 121 can be formed of metal such as tantalum, aluminum, titanium, gold, or platinum. In the case where the sacrificial layer 123 is formed of tungsten, etching of the sacrificial layer 123 may be wet etching with an ammonia peroxide mixture (a solution in which 28 w % of ammonia and 31 w % of oxygenated water are mixed at a ratio of 1:2) or dry etching with a chlorine trifluoride gas. Meanwhile, in the case where the sacrificial layer 123 is formed of polyimide, etching of the sacrificial layer 123 may be wet etching with a commercial polyimide etchant or dry etching with an oxygen plasma.

Next, the relation between the sizes of the upper electrode layers 122 and the lower electrode layers 121 and the structure of the MEMS switch are described. FIGS. 4A to 4E illustrate a manufacturing process of a part of the MEMS switch. It is to be noted that a portion where the structural layer 116 is fixed to the substrate 111 is not illustrated here.

Figure 4A:
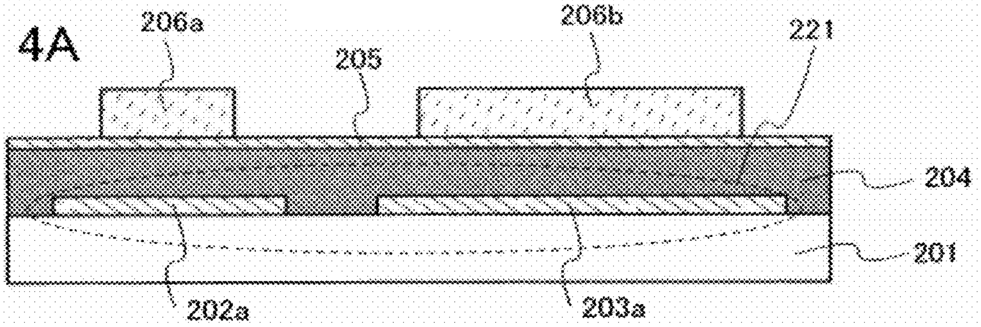
FIGS. 4A to 4E are cross-sectional views illustrating a manufacturing process of a MEMS switch of the present invention.

First, as illustrated in FIG. 4A, a lower electrode layers 221 including an electrode layer 202*a* and an electrode layer 203*a* is formed over a substrate 201 and a sacrificial layer 204 is formed thereover. Then, a conductive layer 205 to form upper electrode layers 222 including an electrode layer 202*b* and an electrode layer 203*b* is formed thereover. Then, in order that the conductive layer 205 may have the shapes of the upper electrode layers 222, a photoresist is formed over the conductive layer 205 to form a resist mask 206*a* and a resist mask 206*b* by a photolithography method.

Figure 4B:
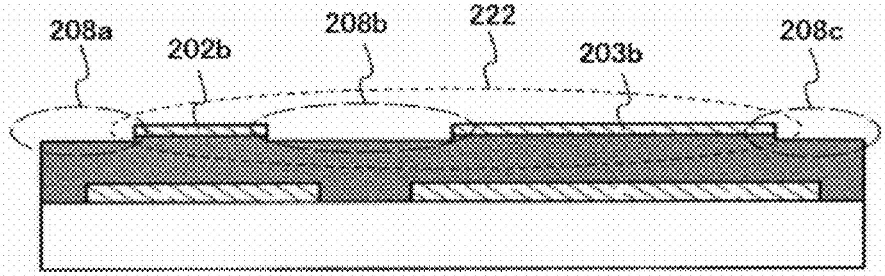

Then, as illustrated in FIG. 4B, the conductive layer 205 is etched to have the shapes of the resist mask 206*a* and the resist mask 206*b*. The etching may be either dry etching or wet etching as long as the plurality of upper electrode layers 222 are completely separated. This is because the upper electrode layers 222 include a drive electrode layer and a switch electrode layer, a high voltage is applied to the drive electrode layers, and a signal is fed to the switch electrode layer; thus, the drive electrode layer and the switch electrode layer are completely insulated. Therefore, the etching of the conductive layer 205 is required to be etching for a time period longer than the standard etching time period required for etching the conductive layer 205 by the entire thickness thereof.

When the conductive layer 205 is overetched, the sacrificial layer 204 under the conductive layer 205 is also etched to no small extent. At this time, the amount of the sacrificial layer 204, which is etched, is affected by the etchant of the conductive layer 205 and the condition of the etching (such as a temperature or a flow rate of a gas). It is difficult to satisfy the condition in which the sacrificial layer 204 is not etched at all no matter how high selectivity is.

One of the reasons is that the sacrificial layer 204 is desirably formed using a conductive material or a material to be removed easily.

Because of the structure of the MEMS switch, by completely removing the sacrificial layer 204, the upper electrode layers and the lower electrode layers can come in contact with each other. Therefore, if even a small part of the sacrificial layer 204 is left on a surface of the switch electrode layer, the switch is not turned on. In order to avoid such a situation, the sacrificial layer 204 is preferably formed using a material to be removed easily so that it can be completely removed when being etched or using a conductive material so that defective connection is not caused even if it cannot be completely removed when being etched.

As the former, that is, a material to be removed easily, a resist and polyimide are given; however, they are easily etched by any etchant and thus it is significantly difficult to set selectivity between the conductive layer 205 and the sacrificial layer 204 to be high when the conductive layer 205 is etched.

As the latter, that is, a conductive material, metal and a semiconductor added with an impurity are given. However, the upper electrode layers 222 are required to have conductive properties and a conductive material can be removed by a similar etchant in many cases; thus, also in this case, it is significantly difficult to set selectivity between the conductive layer 205 and the sacrificial layer 204 to be high.

For example, the case is described, in which the sacrificial layer 204 is formed of tungsten, the conductive layer 205 is formed of a stack of aluminum and titanium (100 nm-thick titanium over 300 nm-thick aluminum), and the conductive layer 205 is subjected to dry etching using a mixed gas of boron trichloride ($BCl_3$) and chlorine ($Cl_2$). In this case, conditions for etching the conductive layer 205 are as follows: the IPC power is 450 W, the bias power is 100 W, the flow rate of boron trichloride is 60 sccm, the flow rate of chlorine is 20 sccm, the pressure in a chamber is 1.9 Pa, and the standard etching time period of the conductive layer 205 is 150 seconds. When overetching of 100% with respect to the standard etching time period is performed (that is to say, when etching is performed for twice the time period of the standard time period), tungsten of the sacrificial layer 204 is etched by approximately 100 nm.

It is needless to say that although overetching is preferably small in normal etching, in the case where complete insulation is required as in processing of the conductive layer 205, the overetching time period is set to be longer. Further, the overetching time period in the case of aiming for the complete insulation varies greatly depending on a material forming the conductive layer 205. The overetching time period is approximately 10 to 250% of the required standard etching time period, preferably 50 to 200% of the required standard etching time period and more preferably 90 to 110% of the required standard etching time period.

Thus, when the conductive layer 205 is etched to form the upper electrode layers 222, a step 208*a*, a step 208*b*, and a step 208*c* are generated in the sacrificial layer 204 due to overetching in processing of the conductive layer 205 as illustrated in FIG. 4B.

Figure 4C:
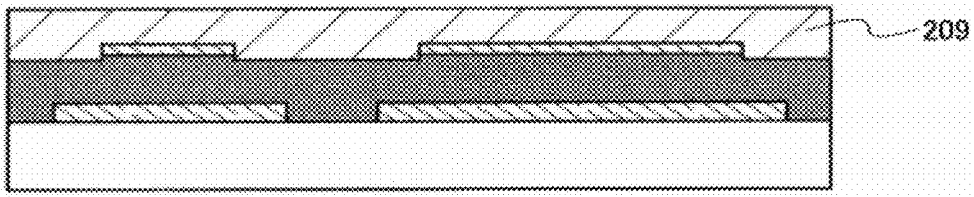
Figure 4D:
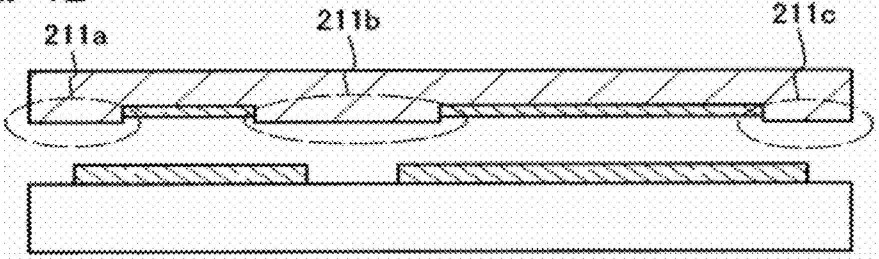

A structural layer 209 is formed over the sacrificial layer 204 and the upper electrode layers 222 as illustrated in FIG. 4C and the sacrificial layer 204 is removed by being etched, so that surfaces of the structural layer 209 on the substrate 201 side protrude from surfaces of the upper electrode layers 222 (on the substrate 201 side). The step 208*a*, the step 208*b*, and the step 208*c* in the sacrificial layer 204, which are generated when the upper electrode layers 222 are processed, reflect on the structural layer 209 to form protrusions. These protrusions are referred to as protrusions 211*a*, 211*b*, and 211*c*.

Here, assuming that an upward direction from the surface of the substrate 201 is a positive direction, the protrusions 211*a*, 211*b*, and 211*c* of the structural layer 209 protrude in a negative direction. That is, it can also be said that the surface of the structural layer 209 on the substrate 201 side is closer to the substrate 201 than surfaces of the upper electrode layers 222 on the substrate 201 side.

Figure 4E:
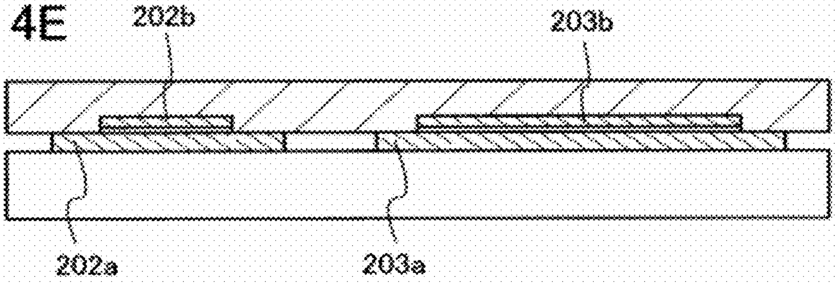

If the MEMS switch thus manufactured is tried to be driven, as illustrated in FIG. 4E, the protrusions 211*a*, 211*b*, and 211*c* of the structural layer 209 come in contact with the lower electrode layers 221 and the upper electrode 202*b* and the upper electrode 203*b* cannot come in contact with the lower electrode 202*a* and the lower electrode 203*a*, respectively, so that the MEMS switch cannot function as a switch.

Figure 5A:
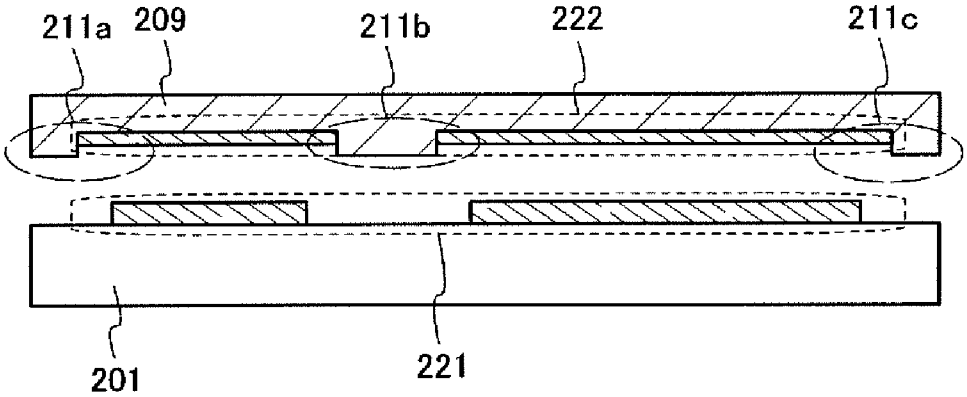
FIGS. 5A and 5B are cross-sectional views illustrating a manufacturing process of a MEMS switch of the present invention.
Figure 5B:
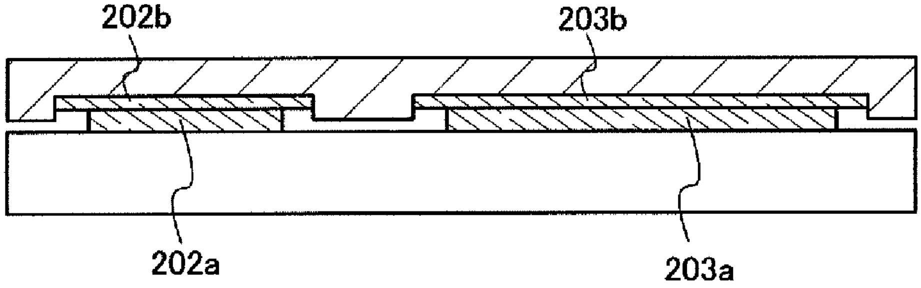

However, as described above, it is very difficult to prevent formation of the protrusions 211*a*, 211*b*, and 211*c* of the structural layer 209 in terms of a process. Therefore, when the protrusions 211*a*, 211*b*, and 211*c* cannot be eliminated, a structure is required in which the MEMS switch functions as a switch even in the case where there are the protrusions 211*a*, 211*b*, and 211*c*. For that purpose, the upper electrode layers 222 may be larger than the lower electrode layers 221 as illustrated in FIGS. 5A and 5B.

In the case of forming the upper electrode layers 222 larger, even if there are protrusions 211*a*, 211*b*, and 211*c*, they are between steps formed by the lower electrode layers 221 and the substrate 201. Therefore, contact between the upper electrode layers 222 and the lower electrode layers 221 is not hindered.

Therefore, as in the case of the switching electrode layers, in the case where the upper electrode layer and the lower electrode layer, for example, are required to come in contact with each other in the micro electro mechanical systems switch (MEMS switch), a structure is decided so that the upper electrode layer is formed to have a larger area than the lower electrode layer.

"Being formed to have a larger area" means that in the case where, for example, each of the upper electrode layer and the lower electrode layer has a square shape or a rectangular shape, each side of the upper electrode layer is longer than that of the lower electrode layer or in the case where, for example, each of them has a circular shape, the radius of the upper electrode layer is longer than that of the lower electrode layer. That is to say, in the case where the upper electrode layer and the lower electrode layer are overlapped with each other, a bottom surface of the upper electrode layer is formed to completely embrace a top surface of the lower electrode layer. It can also be said that a side of a bottom surface of the upper electrode layer, which decides the shape thereof, and a side of a top surface of the lower electrode layer, which decides the shape thereof, do not overlap each other so that the side of the bottom surface of the upper electrode layer is always outside of the side of the top surface of the lower electrode layer. It is to be noted that in the case where a lead wiring portion of the upper and lower electrode layers cannot be taken into consideration, portions of the upper electrode layer, which do not overlap with the lower electrode layer, may be omitted.

Further, even in the case where an upper electrode layer is larger than a lower electrode layer opposite to the upper electrode layer, the upper electrode cannot be large enough to overlap with another lower electrode layer adjacent to the lower electrode layer opposite to the upper electrode layer, as well. Thus, the protrusions of the structural layer come in contact with the lower electrode layer to hinder contact between the upper electrode layer and the lower electrode layer. Further, in the MEMS switch, the upper electrode layer and the lower electrode layer are formed in a pair, so one upper electrode layer cannot be formed large enough to overlap with another lower electrode layer adjacent to a lower electrode layer opposite to the upper electrode layer.

The switch electrode layers are required to come in contact with each other; therefore, in the micro electro mechanical systems switch (MEMS switch) of the present invention, the upper switch electrode layer is formed larger than the lower switch electrode layer.

Embodiment Mode 2

This embodiment mode is described with reference to FIGS. 6A and 6B.

Although a switch electrode layer is described in Embodiment Mode 1, a drive electrode layer is described in this embodiment mode.

In order that a micro electro mechanical systems switch (MEMS switch) may function as a switch, an upper switch electrode layer and a lower switch electrode layer are required to favorably come in contact with each other. However, an upper drive electrode layer and a lower drive electrode layer are made not to come in contact with each other. Since a large potential difference is applied between the upper drive electrode layer and the lower drive electrode layer, when the upper drive electrode layer and the lower drive electrode layer come in contact with each other, a large amount of current flows therethrough so that a significantly large amount of power is consumed for driving of the switch. Further, when a current flows to the upper drive electrode layer and the lower drive electrode layer, light welding occurs due to electric discharge and thus sticking of the upper and lower drive electrode layers is caused.

In order to prevent sticking of the upper and lower drive electrode layers, an insulating layer may be formed on a surface of the drive electrode layer, that is, one or both of a top surface and a bottom surface of the drive electrode layer; however, such formation of an insulating layer is not preferred because of the following reason. That is, in the case where an insulating layer is formed on a surface of the drive electrode layer, a high voltage is applied to the upper drive electrode layer and the lower drive electrode layer to drive the switch; thus, the insulating layer formed over the drive electrode layer polarizes or traps a charge, so that sticking of the drive electrode layer occurs after all.

Therefore, in order to prevent contact between the upper drive electrode layer and the lower drive electrode layer, a stopper for limiting a movable region of a structural layer (also referred to as a bumper or a bump) may be formed. However, in order to form the stopper, another photomask and another manufacturing step are required to be added.

However, in this embodiment mode, by utilizing the protrusions 211*a*, 211*b*, and 211*c* of the structural layer 209, which hinder contact between the upper electrode layers 222 and the lower electrode layers 221, as described in Embodiment Mode 1 with reference to FIG. 4E, the stopper can be formed without adding a photomask and a step.

Figure 6A:
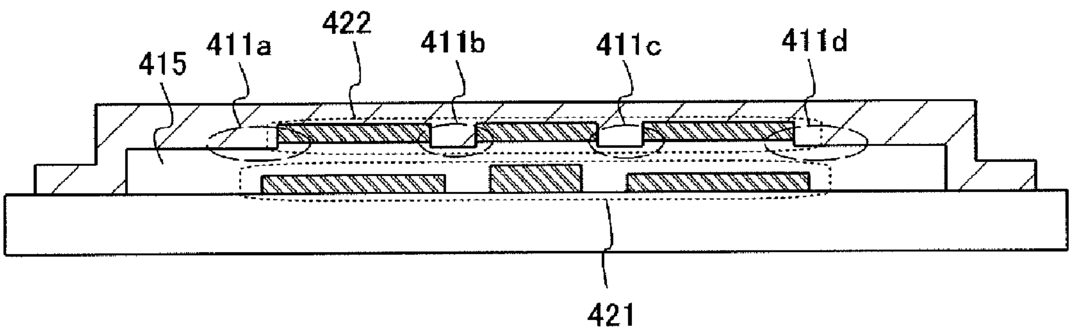
FIGS. 6A and 6B are cross-sectional views illustrating a MEMS switch of the present invention.
Figure 6B:
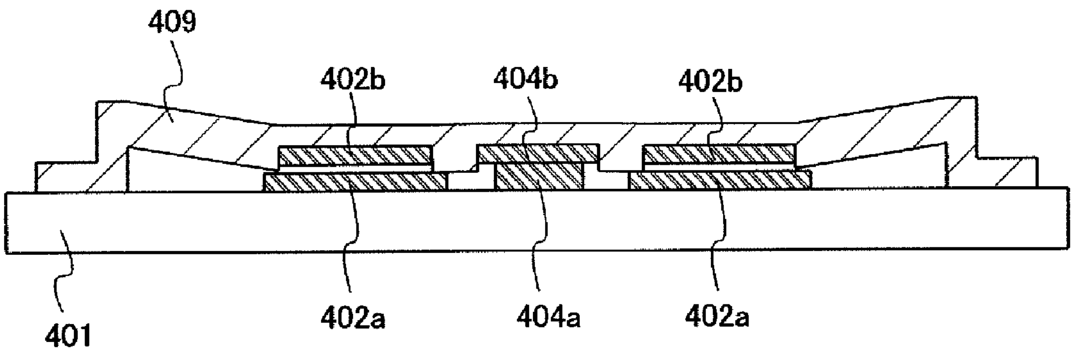

An example of a specific structure of a MEMS switch is illustrated in FIGS. 6A and 6B. FIG. 6A is a cross sectional view illustrating the state where a voltage is not applied to an upper drive electrode layer 402*b* and a lower drive electrode layer 402*a*. FIG. 6B is a cross sectional view illustrating the state where a voltage is applied to the upper drive electrode layer 402*b* and the lower drive electrode layer 402*a*.

The MEMS switch illustrated in FIGS. 6A and 6B includes a substrate 401, a structural layer 409, upper electrode layers 422, and lower electrode layers 421. The upper electrode layers 422 include the upper drive electrode layer 402*b* and an upper switch electrode layer 404*b*, and the lower electrode layers 421 include the lower drive electrode layer 402*a* and a lower switch electrode layer 404*a*.

A space 415 is between the substrate 401 and the structural layer 409. There are a protrusion 411*a*, a protrusion 411*b*, a protrusion 411*c*, and a protrusion 411*d* of the structural layer 409 on the periphery of the upper electrode layers 422.

As for the MEMS switch of this embodiment mode, the upper drive electrode layer 402*b* is formed smaller than the lower drive electrode layer 402*a*. Further, the upper switch electrode layer 404*b* is formed larger than the lower switch electrode layer 404*a* so that they favorably come in contact with each other, as in Embodiment Mode 1.

In the case where each of the upper drive electrode layers 402*b* is smaller than each of the lower drive electrode layers 402*a*, a space is formed between the upper drive electrode layers 402*b* and the lower drive electrode layers 402*a* by the protrusion 411*a*, the protrusion 411*b*, the protrusion 411*c*, and the protrusion 411*d* of the structural layer 409, which are on the periphery of the upper electrode layers 422 as illustrated in FIG. 6B, so that contact between the upper drive electrode layers 402*b* and the lower electrode layers 402*a* can be prevented.

The MEMS switch having such a structure can be manufactured using a design of a photomask by which the shapes of the upper electrode layers 422 are decided and a method described in Embodiment Mode 1. The photomask for forming the upper electrode layers 422 is required regardless of whether a stopper is formed or not; therefore, according to the present invention, the MEMS switch including a stopper for preventing contact between the upper drive electrode layers 402*b* and the lower drive electrode layers 402*a* can be manufactured without adding a photomask and a manufacturing step.

Embodiment 1

In this embodiment, described is a result obtained by manufacturing a switch in which a stopper for preventing contact between upper and lower drive electrode layers of the switch and an upper switch electrode layer and a lower switch electrode layer come in contact with each other as described in Embodiment Modes 1 and 2.

A method for manufacturing the switch is as described in Embodiment Modes 1 and 2. A base layer is formed over a substrate first and then lower electrode layers are formed over the base layer. Then, a sacrificial layer is formed so as to cover the lower electrode layers and upper electrode layers are formed over the sacrificial layer. Here, as each of the base layer, the lower electrode layers, and the sacrificial layer, a layer having a required property may be formed to a given thickness and processed by a photolithography method and etching.

In this embodiment, a glass substrate is used, a 300 nm-thick silicon nitride film containing oxygen is formed for the base layer, and a stack of a 300 nm-thick aluminum film and a 100 nm-thick titanium film is formed for the lower electrode layer. Because the aluminum film alone cannot resist high temperature, the titanium film is stacked over the aluminum film. Then, a 2 μm-thick tungsten film is formed for the sacrificial layer.

The upper electrode layer is formed using a stack of a 300 nm-thick aluminum film and a 100 nm-thick titanium film similarly to the lower electrode layer. In this embodiment, a conductive layer is etched by dry etching using a mixed gas of boron trichloride ($BCl_3$) and chlorine ($Cl_2$). Conditions for etching the conductive layer are as follows: the IPC power is 450 W, the bias power is 100 W, the flow rate of boron trichloride is 60 sccm, the flow rate of chlorine is 20 sccm, the pressure in a chamber is 1.9 Pa, and the standard etching time period of the conductive layer is 150 seconds. Thus, overetching of 100% with respect to the standard etching time period is performed. As a result, the sacrificial layer under the upper electrode layer is etched by approximately 100 nm.

Then, a structural layer is formed so as to cover the sacrificial layer and the upper electrode layer, and a contact hole is formed in the structural layer to form a wiring layer. After that, the structural layer is processed and the sacrificial layer is etched, so that the MEMS switch is completed. Here, each of the structural layer, the wiring layer, and the sacrificial layer, which has a required property, may be formed to a given thickness and processed by a photolithography method and etching similarly to the other layers.

In this embodiment, a 3 μm-thick silicon nitride film containing oxygen is formed for the structural layer and a stack of a 300 nm-thick aluminum film and a 100 nm-thick titanium film is formed and processed for the wiring layer. The sacrificial layer is etched by dry etching using a chlorine trichloride gas at normal temperature and normal pressure.

Figure 7A:
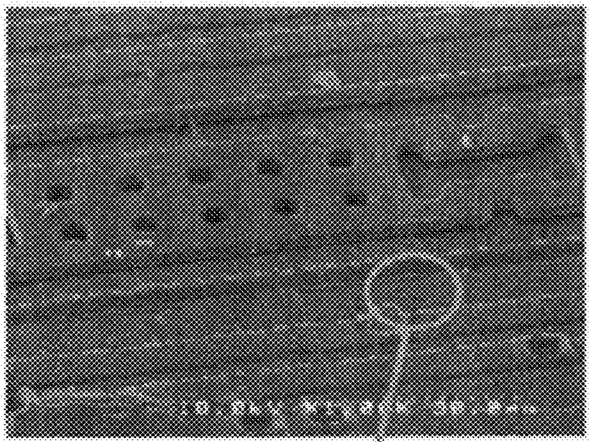
FIGS. 7A and 7B are SEM images of a MEMS switch of the present invention.
Figure 7B:

FIGS. 7A and 7B illustrate SEM (scanning electron microscope) images of the MEMS switch thus manufactured. FIG. 7A is an image of the manufactured MEMS switch seen obliquely from above, and FIG. 7B is an enlarged image of an end portion of the upper electrode layer of the MEMS switch. It can be seen from FIG. 7B that the sacrificial layer is etched by etching of the upper electrode layer, which reflects on formation of protrusions of the structural layer.

Here, in the present invention, the upper switch electrode layer is formed to have a larger area than the lower switch electrode layer and the upper drive electrode layer is formed to have a smaller area than the lower drive electrode layer, so that contact between the upper switch electrode layer and the lower switch electrode layer is prevented from being hindered and the stopper for preventing contact between the upper drive electrode layers and the lower drive electrode layers can be provided.

Further, it can be confirmed that when a voltage is applied between the upper drive electrode layers and the lower drive electrode layers of the MEMS switch manufactured through the above steps, the upper switch electrode layer and the lower switch electrode layer come in contact with each other, whereas the upper drive electrode layers and the lower drive electrode layers do not come in contact with each other.

This application is based on Japanese Patent Application serial no. 2007-293964 filed with Japan Patent Office on Nov. 13, 2007, the entire contents of which are hereby incorporated by reference.

What is claimed is:

1. A MEMS switch comprising:

a structural layer having a beam structure wherein at least one end of the structural layer is fixed to a substrate;

a lower drive electrode layer and a lower switch electrode layer which are provided below the structural layer and over a surface of the substrate; and an upper drive electrode layer and an upper switch electrode layer which are provided on a first portion of a surface of the structural layer, in which the surface faces the substrate, so as to face the lower drive electrode layer and the lower switch electrode layer, respectively, wherein a width along a direction of the upper switch electrode layer is larger than a width along the direction of the lower switch electrode layer, and wherein a second portion of the surface of the structural layer, on which the upper drive electrode layer and the upper switch electrode layer are not provided, protrudes more downward than bottom surfaces of the upper drive electrode layer and the upper switch electrode layer.

2. A MEMS switch comprising:

a structural layer having a beam structure wherein at least one end of the structural layer is fixed to a substrate;

a lower drive electrode layer and a lower switch electrode layer which are provided below the structural layer and over a surface of the substrate; and an upper drive electrode layer and an upper switch electrode layer which are provided on a first portion of a surface of the structural layer, in which the surface faces the substrate, so as to face the lower drive electrode layer and the lower switch electrode layer, respectively, wherein a width along a first direction of the lower drive electrode layer is larger than a width along the first direction of the upper drive electrode layer, wherein a width along a second direction of the upper switch electrode layer is larger than a width along the second direction of the lower switch electrode layer, and wherein a second portion of the surface of the structural layer, on which the upper drive electrode layer and the upper switch electrode layer are not provided, protrudes more downward than bottom surfaces of the upper drive electrode layer and the upper switch electrode layer.

3. A MEMS switch comprising:

a structural layer having a beam structure wherein at least one end of the structural layer is fixed to a substrate;

a lower drive electrode layer and a lower switch electrode layer which are provided below the structural layer and over a surface of the substrate; and an upper drive electrode layer and an upper switch electrode layer which are provided on a first portion of a surface of the structural layer, in which the surface faces the substrate, so as to face the lower drive electrode layer and the lower switch electrode layer, respectively, wherein a width along a direction of the lower drive electrode layer is larger than a width along the direction of the upper drive electrode layer, and wherein a second portion of the surface of the structural layer, on which the upper drive electrode layer and the upper switch electrode layer are not provided, protrudes more downward than bottom surfaces of the upper drive electrode layer and the upper switch electrode layer.

4. The MEMS switch according to claim 1, wherein the structural layer is formed of one selected form the group consisting of a silicon oxide film containing nitrogen, a silicon nitride film containing oxygen and a stack of a silicon oxide film containing nitrogen and a silicon nitride film containing oxygen.

5. The MEMS switch according to claim 2, wherein the structural layer is formed of one selected form the group consisting of a silicon oxide film containing nitrogen, a silicon nitride film containing oxygen and a stack of a silicon oxide film containing nitrogen and a silicon nitride film containing oxygen.

6. The MEMS switch according to claim 3, wherein the structural layer is formed of one selected form the group consisting of a silicon oxide film containing nitrogen, a silicon nitride film containing oxygen and a stack of a silicon oxide film containing nitrogen and a silicon nitride film containing oxygen.

7. The MEMS switch according to claim 1, further comprising a base layer between the substrate and the lower switch electrode layer.

8. The MEMS switch according to claim 2, further comprising a base layer between the substrate and the lower switch electrode layer.

9. The MEMS switch according to claim 3, further comprising a base layer between the substrate and the lower switch electrode layer.

10. A MEMS switch comprising:

a lower drive electrode layer over a substrate;

a lower switch electrode layer over the substrate;

an upper drive electrode layer over the lower drive electrode layer;

an upper switch electrode layer over the lower switch electrode layer;

a structural layer over the upper drive electrode layer and the upper switch electrode layer;

wherein the structural layer has a beam structure and at least one end of the structural layer is on and in contact with the substrate, wherein the upper drive electrode layer and the upper switch electrode layer face the lower drive electrode layer and the lower switch electrode layer, respectively, wherein a width along a direction of the upper switch electrode layer is larger than a width along the direction of the lower switch electrode layer, and wherein a portion of a surface of the structural layer, on which the surface of the structural layer faces to the substrate, and the upper drive electrode layer and the upper switch electrode layer are not provided, is closer to the substrate than bottom surfaces of the upper drive electrode layer and the upper switch electrode layer.

11. A MEMS switch comprising:

a lower drive electrode layer over a substrate;

a lower switch electrode layer over the substrate;

an upper drive electrode layer over the lower drive electrode layer;

an upper switch electrode layer over the lower switch electrode layer;

a structural layer over the upper drive electrode layer and the upper switch electrode layer;

wherein the structural layer has a beam structure and at least one end of the structural layer is on and in contact with the substrate, wherein the upper drive electrode layer and the upper switch electrode layer face the lower drive electrode layer and the lower switch electrode layer, respectively, wherein a width along a first direction of the lower drive electrode layer is larger than a width along the first direction of the upper drive electrode layer, wherein a width along a second direction of the upper switch electrode layer is larger than a width along the second direction of the lower switch electrode layer, and wherein a portion of a surface of the structural layer, on which the surface of the structural layer faces to the substrate, and the upper drive electrode layer and the upper switch electrode layer are not provided, is closer to the substrate than bottom surfaces of the upper drive electrode layer and the upper switch electrode layer.

12. A MEMS switch comprising:

a lower drive electrode layer over a substrate;

a lower switch electrode layer over the substrate;

an upper drive electrode layer over the lower drive electrode layer;

an upper switch electrode layer over the lower switch electrode layer;

a structural layer over the upper drive electrode layer and the upper switch electrode layer;

wherein the structural layer has a beam structure and at least one end of the structural layer is on and in contact with the substrate, wherein the upper drive electrode layer and the upper switch electrode layer face the lower drive electrode layer and the lower switch electrode layer, respectively, wherein a width along a direction of the lower drive electrode layer is larger than a width along the direction of the upper drive electrode layer, and wherein a portion of a surface of the structural layer, on which the surface of the structural layer faces to the substrate, and the upper drive electrode layer and the upper switch electrode layer are not provided, is closer to the substrate than bottom surfaces of the upper drive electrode layer and the upper switch electrode layer.

13. The MEMS switch according to claim 10, wherein the lower switch electrode layer is thicker than the lower drive electrode layer.

14. The MEMS switch according to claim 11, wherein the lower switch electrode layer is thicker than the lower drive electrode layer.

15. The MEMS switch according to claim 12, wherein the lower switch electrode layer is thicker than the lower drive electrode layer.

16. The MEMS switch according to claim 10, further comprising a hole penetrating the structural layer.

17. The MEMS switch according to claim 11, further comprising a hole penetrating the structural layer.

18. The MEMS switch according to claim 12, further comprising a hole penetrating the structural layer.

19. The MEMS switch according to claim 10, wherein the structural layer is formed of one selected form the group consisting of a silicon oxide film containing nitrogen, a silicon nitride film containing oxygen and a stack of a silicon oxide film containing nitrogen and a silicon nitride film containing oxygen.

20. The MEMS switch according to claim 11, wherein the structural layer is formed of one selected form the group consisting of a silicon oxide film containing nitrogen, a silicon nitride film containing oxygen and a stack of a silicon oxide film containing nitrogen and a silicon nitride film containing oxygen.

21. The MEMS switch according to claim 12, wherein the structural layer is formed of one selected form the group consisting of a silicon oxide film containing nitrogen, a silicon nitride film containing oxygen and a stack of a silicon oxide film containing nitrogen and a silicon nitride film containing oxygen.

* * * * *